TUNABLE OSCILLATOR CIRCUITS CAPABLE OF OSCILLATION WITHIN BOTH A HIGH AND A LOWER FREQUENCY BAND

Filed Oct. 5, 1966

United States Patent Office 3,401,356
Patented Sept. 10, 1968

3,401,356

TUNABLE OSCILLATOR CIRCUITS CAPABLE OF OSCILLATION WITHIN BOTH A HIGH AND A LOWER FREQUENCY BAND

Thomas Cafarella, Forest Hills, and George Doncese, Glen Cove, N.Y., assignors to Hazeltine Research Inc., a corporation of Illinois Filed Oct. 5, 1966, Ser. No. 584,442
10 Claims. (Cl. 331—117)

ABSTRACT OF THE DISCLOSURE

Disclosed is a tunable oscillator circuit including an electron device and capable of oscillation over both a high frequency band and a lower frequency band. The oscillator utilizes the frequency dependent impedance characteristic of a series resonant circuit connected in a feedback loop between a variable resonant load circuit and electron device. Also disclosed is the use of a frequency dependent resistance device connected between a first circuit operative in a high frequency band and a second circuit operative in a lower frequency band. The device includes a conductor and a body of ferrite material coaxial therewith, for automatically providing a relatively high resistance coupling for frequencies in the high frequency band and a relatively low resistance coupling for frequencies in the lower frequency band. Other embodiments of the tunable oscillator circuit and the resistance device are disclosed.

The present invention relates generally to oscillator circuits, and more particularly to tunable oscillator circuits which are capable of sustaining oscillation within both a high frequency band and a lower frequency band.

Simple oscillators which are capable of being tuned over both a high frequency band and a lower frequency band are becoming necessary for many applications. An oscillator of this type would be especially useful as the common local oscillator (L.O.) in a combination VHF-UHF tuner for television receivers, replacing the two independent local oscillators presently used in the separate UHF and VHF tuners of prior art all-channel television receivers. In this case the aforementioned high frequency band would be the UHF L.O. band (517–937 mHz.) and the lower frequency band would be the VHF L.O. band (101–264 mHz.) In general, however, two major problem areas are encountered in attempting to develop a simple oscillator which will perform satisfactorily over this wide frequency range. First, a feedback path which will automatically provide the proper degree of feedback for all frequencies in both the high frequency and lower frequency bands must be devised. Secondly, a variable resonant circuit capable of spurious free tuning over this wide frequency range is necessary.

It is therefore an object of the present invention to provide a tunable oscillator circuit capable of oscillation over both a high frequency band and a lower frequency band.

It is another object of the present invention to provide a simplified tunable oscillator circuit for use as the sole local oscillator in a combined VHF–UHF television tuner, wherein said oscillator is capable of oscillation over both the high UHF L.O. band and the lower VHF L.O. band.

It is still another object of the present invention to provide in a tunable oscillator circuit, for example, a frequency dependent resistance device including a body of ferrite material, for providing a relatively high resistance coupling between two circuits for high frequencies and a relatively low resistance coupling therebetween for lower frequencies.

In accordance with the present invention a tunable oscillator circuit capable of oscillation over both a high frequency band and a lower frequency band, apparatus comprises a variable resonant load means capable of being tuned over both the high and lower frequency bands and means connected to the load means for providing predominantly inductive coupling to the load means for signals in the high frequency band and for providing predominantly capacitive coupling to the load means for signals in the lower frequency band.

In accordance with another aspect of the present invention a tunable oscillator circuit capable of oscillation over both a high frequency band and a lower frequency band, frequency dependent electrical apparatus comprises a first resonant circuit operative over the high frequency band, a second resonant circuit operative over the lower frequency band and a frequency dependent resistance device, including a conductor connected between the first and second circuits and a body of ferrite material coaxial with the conductor and disposed adjacent the surface thereof over a predetermined portion of the length of the conductor, for providing a relatively high resistance coupling therebetween for signals within the high frequency band and a relatively low resistance coupling therebetween for signals within said lower frequency band.

In accordance with a further aspect of the present invention frequency dependent electrical apparatus comprises a first circuit operative over a high frequency band, a second circuit operative over a lower frequnecy band and a frequency dependent resistance device, including a body of lossy dielectric material, connected between the first and second circuits for providing a relatively high resistance coupling therebetween for frequencies within the high frequency band and a relatively low resistance coupling therebetween for frequencies within the lower frequency band.

For a better understanding of the present invention together with other and further objects thereof, reference is had to the following description taken in connection with the accompanying drawing, and its scope will be pointed out in the appended claims.

Referring to the drawing.

Figure 1:
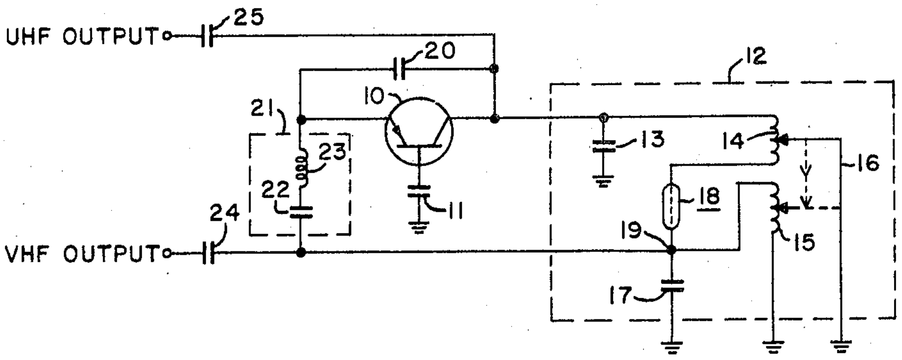
FIG. 1 is a circuit diagram of a tunable oscillator circuit constructed in accordance with one form of the invention.

*Description of the circuit of FIG. 1*

In FIG. 1 of the drawings there is shown a tunable oscillator circuit which embodies the present invention in one form, and is suitable for use as the combined UHF-VHF local oscillator in the tuner of an all-channel television receiver. As such, the oscillator circuit of FIG. 1 is tunable over both a high frequency band and a lower frequency band, which in the present example are the UHF L.O. band of 517–937 mHz., and the VHF L.O. band of 101–264 mHz. respectively.

The oscillator circuit of FIG. 1 includes an electron device having first, second and third electrodes, which in this instance is a conventional PNP transistor 10 and its attendant base, collector and emitter electrodes, respectively. Connected between the base of transistor 10 and ground is a capacitor 11, which comprises means for coupling the base electrode to a source of reference potential. Similarly, connected between the collector and emitter of transistor 10 is another capacitor 20, which comprises means for alternating-current coupling the collector electrode to the emitter electrode.

Also included in the oscillator circuit of FIG. 1 is variable resonant load means, consisting of the components within dotted box 12, connected between the collector of transistor 12 and ground, and capable of being tuned over both the high UHF L.O. band and the lower VHF L.O. band, for providing a variable resonant coupling between the collector electrode and ground. As shown in FIG. 1, means 12 includes a capacitor 13 connected directly between the collector of transistor 10 and ground. Means 12 also includes the series combination of a UHF inductance 14, a frequency dependent resistance device 18 and the parallel combination of capacitor 17 and VHF inductance 15, which series combination is also connected between the collector of transistor 10 and ground. A more detailed description of frequency dependent resistance device 18 is set forth hereinafter. It is sufficient at this point to understand that device 18 presents a relatively high resistance for frequencies within the high UHF L.O. band, and presents a relatively low resistance for frequencies within the lower VHF L.O. band. There is also included in means 12, an adjustable wiper 16, which may be adjusted over the length of both the UHF inductance 14 and the VHF inductance 15, and which is connected to ground.

Figure 2:
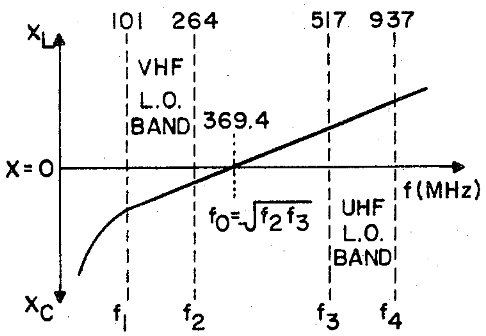
FIG. 2 is a graph useful in explaining the operation of the oscillator circuit of FIG. 1.

There is finally included in the oscillator circuit of FIG. 1 the components within the dotted box 21 which comprises means connected between the variable resonant circuit means 12 and the emitter of transistor 10 for providing a predominantly inductive coupling therebetween during oscillation in said high UHF L.O. band, and predominantly capacitive coupling therebetween during oscillation in said lower VHF L.O. band. As shown in FIG. 1, means 21 includes the series combination of an inductor 23 and a capacitor 22 connected between the emitter of transistor 10 and a junction point 19 between the frequency dependent resistance device 18 and capacitor 17 in the variable resonant circuit means 12. The series combination of inductor 23 and capacitor 22 is designed to be resonant at a frequency between the upper end of the VHF L.O. band and the lower end of the UHF L.O. band, that is, at a frequency between 264 mHz. and 517 mHz., respectively. This resonant frequency may, for example, be the geometric mean between the end frequencies 265–517 mHz., or 369.4 mHz., in which case the approximate over-all impedance characteristic of the series circuit 21 would be that shown in the graph of FIG. 2. From the graph it will be seen that within the high UHF L.O. band, circuit 21 presents a predominantly inductive impedance, while within the lower VHF L.O. band, circuit 21 presents a predominantly capacitive impedance.

In the tunable oscillator circuit of FIG. 1, the resulting UHF L.O. output signal is supplied from the collector of transistor 10 via a coupling capacitor 25, while the resulting VHF L.O. output signal is supplied from the junction point 19 via a coupling capacitor 24.

*Operation of the circuit of FIG. 1*

In operation, the oscillator circuit shown in the embodiment of FIG. 1 is tunable over both the high UHF L.O. band of 517–937 mHz. and the lower VHF L.O. band of 101–264 mHz. by mere adjustment of the wiper 16 over the length of the UHF inductance 14 and VHF inductance 15, respectively, within the variable resonant load means 12.

During oscillation over the VHF L.O. band, the impedance presented by UHF inductance 14 is very small, so that it may be considered as presenting effectively a short circuit between the collector of transistor 10 and the upper end of frequency dependent resistance device 18. Likewise, and as was mentioned previously, during VHF oscillation, device 18 presents a relatively low resistance for frequencies within the lower VHF L.O. band. It can therefore be seen that during oscillation over the VHF L.O. band, a tunable tank circuit, consisting primarily of a variable inductance (the combination of VHF inductance 15 and wiper 16) in parallel with a fixed capacitance (the combination of capacitors 13 and 17) provides a variable resonant coupling between the collector of transistor 10 and ground. By adjusting wiper 16 over the length of VHF inductance 15 the resonant frequency of this coupling may be varied over the VHF L.O. band of 101–264 mHz.

Oscillation over the VHF L.O. band is produced by providing the required degree of feedback between the collector and emitter of transistor 10. During VHF oscillation, two separate feedback paths are operative. First, feedback is provided via capacitor 20 connected directly between the collector and emitter. Secondly, additional feedback is provided by circuit 21, which, as mentioned previously, presents a predominantly capacitive impedance for frequencies within the VHF L.O. band. The degree of feedback provided by capacitor 20 above at VHF L.O. frequencies is not sufficient to sustain oscillation. However, the additional feedback introduced by the predominantly capacitive impedance of circuit 21 at VHF L.O. frequencies is sufficient to provide the over-all degree of feedback necessary to sustain oscillation over the entire VHF L.O. band.

During UHF oscillation, frequency dependent resistance device 18 presents a relatively high resistance for frequencies within the high UHF L.O. band. This serves to electrically separate UHF inductor 14 from VHF inductance 15, and to damp out any spurious UHF signals which might be introduced in the VHF inductance as a result of the inherent small inductance presented by wiper 16 and its ground connection at UHF L.O. frequencies. Hence, during oscillation over the UHF L.O. band, a tunable tank circuit consisting of capacitor 13 in parallel with the variable inductance formed by the combination of UHF inductance 14 and wiper 16, provides a variable resonant coupling between the collector of transistor 10 and ground. By adjusting wiper 16 over the length of UHF inductance 14, the resonant frequency of this coupling may be varied over the UHF L.O. band of 517–937 mHz.

Oscillation over the UHF L.O. band is produced by introducing the required degree of feedback between the collector and emitter of transistor 10 by means of feedback capacitor 20. Since capacitor 20 alone furnishes sufficient feedback to sustain oscillation at UHF, the added feedback provided by circuit 21 at VHF is not required, and in fact, the emitter of transistor 10 should be isolated from the VHF components 15 and 17 in order to prevent additional spurious resonances and losses in the UHF tank circuit. This isolation is automatically provided by circuit 21 which presents a predominantly inductive impedance for frequences within the UHF L.O. band, thus serving as an RF choke on the emitter of transistor 10, as will be seen from the graph of FIG. 2.

Thus, it has been shown that the tunable oscillator circuit of FIG. 1 is capable of oscillation over both the high UHF L.O. band and the lower VHF L.O. band by merely adjusting the wiper 16. This is made possible primarily through novel use of the series resonant circuit 21, in that during VHF operation circuit 21 provides the additional feedback necessary to sustain oscillation over the VHF L.O. band, while during UHF operation, circuit 21 does not effect feedback, but instead serves to isolate the emitter of transistor 10 from the VHF components in circuit 12 over the UHF L.O. band.

While the following component values have been found to provide satisfactory performance of the tunable oscillator circuit of FIG. 1, these values are provided merely as examples, and are not intended to limit the invention in any manner.

| | |
|---|---|
| Transistor **10** | Siemens AF139. |
| Capacitor **11** | 1000 $\mu\mu$f. |
| Capacitor **13** | Distributed capacity of UHF inductor plus a .3$\mu\mu$f.–3$\mu\mu$f. trimmer. |
| Capacitor **17** | 10 $\mu\mu$f. |
| Capacitor **20** | 0.5 $\mu\mu$f. |
| Capacitor **24** | 2 $\mu\mu$f. |
| Capacitor **25** | 0.5 $\mu\mu$f. |
| Series resonant circuit **21**: | |
| Capacitor **22** | 3 $\mu\mu$f. |
| Inductor **23** | .07 $\mu$h. |
| Resonant frequency | 369.4 mHz. |
| Ferrite for device **18** | Siemens U–17. |

*Description of device 18*

Figure 3:
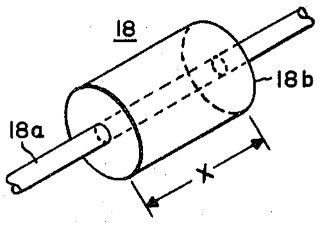
FIG. 3 is an isometric drawing of electrical apparatus constructed in accordance with another aspect of the invention.

In the oscillator circuit of FIG. 1 is included a frequency dependent resistance device 18 which has been disclosed previously herein as presenting a relatively high resistance for frequencies within the high UHF L.O. band (517–937 mHz.), and a relatively low resistance for frequencies within the lower VHF L.O. band (101–264 mHz.). A typical embodiment of this device is shown in more detail in FIG. 3. As shown in FIG. 3, device 18 includes a conductor 18*a*, and a body of lossy dielectric material 18*b*, in this case ferrite, coaxial with the conductor and disposed adjacent the surface thereof over a predetermined portion (X) of the length of conductor 18*a*. As shown in FIG. 1, in use one end of device 18 is connected to a first circuit operative over a high frequency band (the UHF inductance 14 operative over the high UHF L.O. band), while the other end is connected to a second circuit operative over a lower frequency band (the VHF inductance 15 and capacitor 17 operative over the lower VHF L.O. band).

In the particular embodiment of FIG. 3, the body of ferrite material 18*b* is shown as a cylinder which surrounds the conductor 18*a* for a distance X along its length. The ferrite body may be permanently molded to the conductor or it may, for example, be formed separately with a hole along its axis, and then threaded onto the conductor much in the same way as a bead is strung on a string. If the latter construction technique is used it is preferable that the hole in the ferrite body be as close to the size of the conductor as possible. This will ensure a minimum air gap between the ferrite and the conductor, resulting in a greater over-all efficiency of operation for the device.

*Operation of the device 18*

Figure 4:
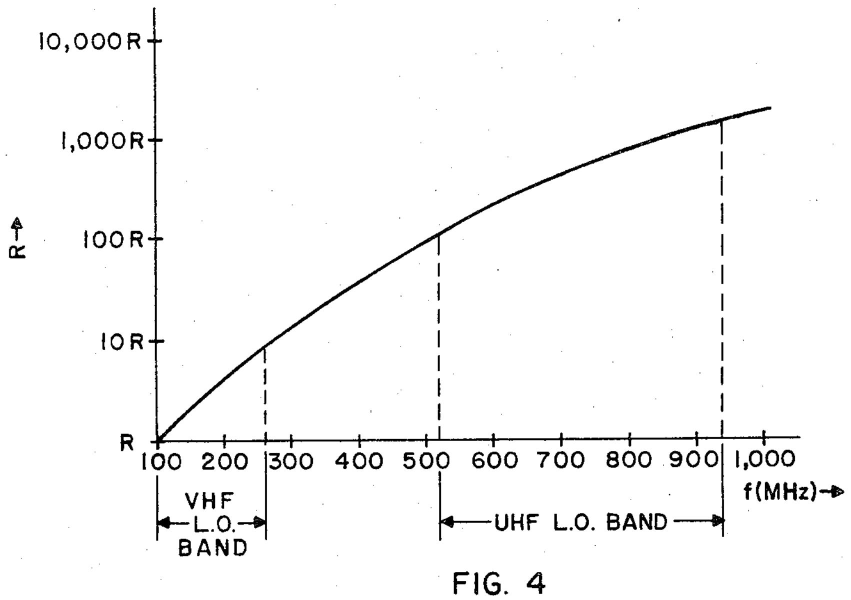
FIG. 4 is a graph useful in explaining the operation of the apparatus of FIG. 3.

In operation, the device 18 functions as a frequency dependent resistance for high frequencies, with the resistance versus frequency characteristic determined by the type of lossy dielectric material used. This is shown in the graph of FIG. 4 which depicts the approximate resistance versus frequency characteristic for a typical device constructed of the ferrite material No. U–17 supplied by the German firm of Siemens & Halske Aktiengesellschaft. As shown in FIG. 4, the device presents a minimum resistance for frequencies within the VHF L.O. band of 101–264 mHz. and a substantially higher resistance (in this case approximately 100 to 1000 times higher) for frequencies within the UHF L.O. band of 517–937 mHz.

Specifically, as high frequency current passes through conductor 18*a* a magnetic field is established surrounding the conductor. As this field passes through the body of ferrite, particularly that portion of the ferrite which is immediately adjacent the conductor's surface, the field is attenuated by an amount which is determined by the particular ferrite material chosen. This attenuation is due to energy loss within the ferrite material itself. Thus, the high frequency currents in the conductor are likewise attenuated, just as though the conductor were broken and a resistance inserted in series with the broken ends. As the frequency of the current in conductor 18*a* becomes lower, the losses within the ferrite body becomes less, thus lessening the attenuation of these currents as shown in the graph of FIG. 4. Since most of the energy loss occurs in the region of ferrite material immediately adjacent the conductor's surface, the radial thickness of the ferrite body need not be very large. For a device having the characteristic of FIG. 4, a suitable radial thickness would be approximately 1/16–1/8 of an inch. Likewise, since the energy loss occurs in this region of ferrite material immediately adjacent the conductor, the loss can be increased, and the attenuation of currents therefore accordingly increased, by increasing the axial length of the ferrite body; that is, by surrounding a greater length (X) of the conductor with the ferrite body.

In this manner, devices constructed in accordance with this aspect of the present invention can be designed to electrically isolate two circuits which are operative in different and separated high frequency bands, but which must be electrically coupled together by as low an impendance as possible in the lower of these two high frequency bands. Furthermore, such devices can perform the active function of damping out spurious signals during operation in the higher of the two frequency bands as was disclosed previously in the description of the circuit 12 of FIG. 1.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A tunable oscillator circuit capable of oscillation over both a high frequency band and a lower frequency band, comprising:

an electron device having at least three electrodes;

variable resonant load means connected between an electrode of said electron device and a source of reference potential and capable of being tuned over both said high and lower frequency bands for providing a variable resonant coupling between said electron device and said source of reference potential;

and means connected between said load means and another electrode of said electron device, for automatically providing predominantly inductive coupling therebetween for signals in said high frequency band and predominantly capacitive coupling therebetween for signals in said lower frequency band independent of switching devices.

2. A tunable oscillator circuit in accordance with claim 1 wherein the means connected between said load means and said electron device is a series resonant circuit having a resonant frequency intermediate said high and lower frequency bands and automatically exhibiting a predominantly inductive impedance for frequencies in said high frequency band and a predominantly capacitive impedance for frequencies in said lower frequency band.

3. A tunable oscillator circuit capable of oscillation over both a high frequency band and a lower frequency band, comprising:

an electron device having first, second and third electrodes;

means for coupling said first electrode to a source of reference potential;

means for alternating-current coupling said second electrode to said third electrode;

variable resonant load means connected between said second electrode and said source of reference potential and capable of being tuned over both said high and lower frequency bands, for providing a variable resonant coupling between said second electrode and said source of reference potential;

and means connected between said variable resonant load means and said third electrode, for automatically providing predominantly inductive coupling therebetween during oscillation in said high frequency band and predominantly capacitive coupling therebetween during oscillation in said lower frequency band independent of switching devices.

4. A tunable oscillator in accordance with claim 3 wherein the means connected between said variable resonant load means and said third electrode is a series resonant circuit having a resonant frequency intermediate said high and lower frequency bands, and automatically exhibiting a predominantly inductive impedance for signals in said high frequency band and a predominantly capacitive impedance for signals in said lower frequency band.

5. A tunable oscillator circuit in accordance with claim 3 wherein the means for coupling said first electrode to a source of reference potential is a first capacitor connected between said first electrode and ground, wherein said alternating current coupling means is a second capacitor connected between said second and third electrodes, and wherein the means connected between said variable resonant load means and said third electrode is a series resonant circuit consisting of a capacitor and an inductor connected in series and having a resonant frequency intermediate said high and lower frequency bands, and automatically exhibiting a predominantly inductive impedance for signals in said high frequency band and a predominantly capacitive impedance for signals in said lower frequency band.

6. A tunable oscillator circuit for a UHF–VHF television receiver and capable of oscillation over both a UHF local oscillator band and a VHF local oscillator band, comprising:

a transistor having base, collector and emitter electrodes;

a first capacitor connected between said base electrode and ground;

a second capacitor connected between said collector electrode and said emitter electrode;

a variable resonant load circuit, connected between said collector electrode and ground, and having a resonant frequency which may be adjusted over said UHF local oscillator band and said VHF local oscillator band, for providing a variable parallel resonant coupling between said collector electrode and ground;

and a series resonant circuit consisting of a capacitor and inductor connected in series between said variable resonant load circuit and said emitter electrode, and having a resonant frequency intermediate said UHF local oscillator band and said VHF local oscillator band for automatically providing a predominantly inductive impedance therebetween for signals in said UHF local oscillator band and a predominantly capacitive impedance therebetween for signals in said VHF local oscillator band.

7. A tunable oscillator circuit in accordance with claim 3 wherein said variable resonant load means includes a first resonant circuit connected to said second electrode and operative over said high frequency band, a second resonant circuit connected to said source of reference potential and operative over said lower frequency band, and a frequency dependant resistance device, including a conductor connected between said first and second resonant circuits and a body of ferrite material coaxial with said conductor and disposed adjacent the surface thereof over a predetermined portion of the length of said conductor, for providing a relatively high resistance coupling therebetween for signals in said high frequency band and a relatively low resistance coupling therebetween for signals in said lower frequency band.

8. In a tunable oscillator circuit capable of oscillation over both a high frequency band and a lower frequency band, frequency dependent electrical apparatus, comprising:

a first resonant circuit operative over said high frequency band;

a second resonant circuit operative over said lower frequency band;

and a frequency dependent resistance device, including a conductor connected between said first and second circuits and a body of ferrite material coaxial with said conductor and disposed adjacent the surface thereof over a predetermined portion of the length of said conductor, for providing a relatively high resistance coupling therebetween for signals within said high frequency band and a relatively low resistance coupling therebetween for signals within said lower frequency band.

9. Frequency dependent electrical apparatus, comprising:

a first circuit operative over a high frequency band;

a second circuit operative over a lower frequency band;

and a frequency dependent resistance device, including a body of lossy dielectric material, connected between said first and second circuits for providing a relatively high resistance coupling therebetween for frequencies within said high frequency band and a relatively low resistance coupling therebetween for frequencies within said lower frequency band.

10. Apparatus in accordance with claim 9 wherein said device comprises a conductor connected between said first and second circuits and a body of ferrite material coaxial with said conductor and disposed adjacent the surface thereof over a predetermined portion of the length of said conductor, whereby high frequency currents passing through said conductor are substantially attenuated by said body of ferrite material whereas lower frequency currents passing through said conductor are relatively unattenuated by said body of ferrite material.

References Cited

UNITED STATES PATENTS

| | | | |
|---|---|---|---|
| 3,324,412 | 6/1967 | Boomgaard | 331—117 |
| 3,328,720 | 6/1967 | Arntsen | 331—117 |

JOHN KOMINSKI, *Primary Examiner.*